(12) United States Patent
Xu

(10) Patent No.: US 11,721,812 B2
(45) Date of Patent: Aug. 8, 2023

(54) FILM AND MANUFACTURING PROCESS THEREOF

(71) Applicant: XINGYAO TECHNOLOGY (SHENZHEN) CO., LTD, Shenzhen (CN)

(72) Inventor: Jingrui Xu, Shenzhen (CN)

(73) Assignee: XINGYAO TECHNOLOGY (SHENZHEN) CO., LTD, Shenzhen (CN)

(*) Notice: Subject to any disclaimer, the term of this patent is extended or adjusted under 35 U.S.C. 154(b) by 0 days.

(21) Appl. No.: 17/292,433

(22) PCT Filed: Nov. 9, 2018

(86) PCT No.: PCT/CN2018/114906
§ 371 (c)(1),
(2) Date: May 8, 2021

(87) PCT Pub. No.: WO2020/093395
PCT Pub. Date: May 14, 2020

(65) Prior Publication Data
US 2022/0021002 A1    Jan. 20, 2022

(51) Int. Cl.
*H01M 4/66* (2006.01)
*C23C 28/00* (2006.01)

(52) U.S. Cl.
CPC .......... *H01M 4/667* (2013.01); *C23C 28/345* (2013.01); *C23C 28/42* (2013.01); *H01M 4/661* (2013.01); *H01M 4/668* (2013.01); *Y10T 428/24975* (2015.01)

(58) Field of Classification Search
None
See application file for complete search history.

(56) References Cited

U.S. PATENT DOCUMENTS

| 10,573,856 | B2* | 2/2020 | Maclean | H01M 50/116 |
| 2005/0147877 | A1* | 7/2005 | Tarnowski | H01M 50/183 |
| | | | | 429/185 |
| 2014/0322590 | A1* | 10/2014 | Mank | H01M 10/058 |
| | | | | 429/163 |
| 2018/0301709 | A1* | 10/2018 | Qiu | C23C 14/30 |

(Continued)

FOREIGN PATENT DOCUMENTS

| CN | 107123812 A | 9/2017 |
| CN | 107154499 A | 9/2017 |
| CN | 207097950 U | 3/2018 |

(Continued)

*Primary Examiner* — Frank J Vineis
*Assistant Examiner* — Nicole T Gugliotta
(74) *Attorney, Agent, or Firm* — Bayramoglu Law Offices LLC

(57) ABSTRACT

A film includes a base layer, where each of front and back sides of the base layer is provided with a bonding layer, a composite structure layer, an aluminum material layer, and an anti-oxidation layer in sequence. The composite structure layer includes at least two structure layers. Each structure layer is composed of an aluminum material layer and a reinforcement layer, and the structure layers are stacked. With the composite structure layer, the new film has a resistivity as low as $4.5\times10^{-8}$ $\Omega\cdot$m, a peel force as high as 4.8 N to 5.2 N, and improved bonding force and compactness.

19 Claims, 4 Drawing Sheets

(56) References Cited

U.S. PATENT DOCUMENTS

2020/0044258 A1* 2/2020 Yan .................. H01M 4/667
2020/0243810 A1* 7/2020 Yamashita .......... H01M 50/124

FOREIGN PATENT DOCUMENTS

| JP | H10112323 A | 4/1998 |
| JP | 2003282064 A | 10/2003 |
| JP | 2004273304 A | 9/2004 |
| JP | 2006512722 A | 4/2006 |
| JP | 2006327177 A | 12/2006 |
| JP | 2013165250 A | 8/2013 |
| WO | 2005082024 A2 | 9/2005 |
| WO | 2012146310 A1 | 11/2012 |

* cited by examiner

FILM AND MANUFACTURING PROCESS THEREOF

CROSS REFERENCE TO THE RELATED APPLICATIONS

This application is the national phase entry of International Application No. PCT/CN2018/114906, filed on Nov. 9, 2018, the entire contents of which are incorporated herein by reference.

TECHNICAL FIELD

The present disclosure belongs to the technical field of energy storage element materials, and specifically relates to a film and a manufacturing process thereof.

BACKGROUND

With the development of industries and the depletion of fossil energy, the environmental pollution and energy shortage problems are getting worse, so it is necessary to find new energy sources and develop new energy-saving tools.

A lithium energy storage element uses aluminum foil as a positive electrode material, and the existing aluminum foil has a maximum thickness only of 8 μm. With the development of energy storage element technology, there are higher requirements for the volume and weight of energy storage elements, and a cathode current collector structure for ultra-thin energy storage elements has been gradually developed, where an aluminum layer is coated on a plastic base layer. However, during the charging and discharging process of the energy storage elements, the coated aluminum layer easily falls off from the plastic base layer due to a low bonding strength between the two layers.

In the prior art, a bonding layer for connecting a copper coating with the plastic base layer is adopted, but the coating still easily falls off.

SUMMARY

An objective of the present disclosure is to overcome the problems existing in the prior art and provide a film that does not easily fall off and has high adhesive strength and low resistivity.

Another objective of the present disclosure is to provide a simple film manufacturing process with low cost.

The present disclosure adopts the following technical solutions:

The present disclosure provides a film including a base layer, where each of front and back sides of the base layer is provided with a bonding layer, a composite structure layer, an aluminum material layer, and an anti-oxidation layer in sequence; and the composite structure layer includes at least two structure layers, each structure layer is composed of an aluminum material layer and a reinforcement layer, and the multiple structure layers are stacked.

2 to 50 structure layers may be provided.

10 to 30 structure layers may be provided.

The present disclosure also provides a film including a base layer, where the base layer is provided with a bonding layer, an aluminum material layer, a reinforcement layer, an aluminum material layer, and an anti-oxidation layer in sequence.

The base layer may be made of one or more materials from the group consisting of OPP, PET, PI, PS, PPS, CPP, PEN, PVC, SPS, PEEK, PES, PPSU, PE, and non-woven fabric.

The base layer may have a thickness of 1.2 μm to 12 μm.

The bonding layer may be a non-metallic material layer, and the non-metallic material may be at least one from the group consisting of SiC, $Si_3N_4$, $SiO_x$ ($1.5 \leq x \leq 2$), and $AlO_x$ ($1 \leq x \leq 1.5$).

The bonding layer may have a thickness of 2 nm to 50 nm.

The bonding layer has a thickness of 8 nm to 20 nm when composed of $AlO_x$ ($1 \leq x \leq 1.5$); and the bonding layer has a thickness of 10 nm to 40 nm when composed of $SiO_x$ ($1.5 \leq x \leq 2$).

The aluminum material layer may have a thickness of 20 nm to 1,500 nm.

The aluminum material layer may have a thickness of 20 nm to 100 nm.

The reinforcement layer may be a dense non-metallic material layer with a composition of $AlO_x$ ($1 \leq x \leq 1.5$).

The reinforcement layer may have a thickness of 2 nm to 50 nm.

The reinforcement layer may have a thickness of 3 nm to 6 nm.

The anti-oxidation layer may be a dense non-metallic material layer with a composition of $AlO_x$ ($1 \leq x \leq 1.5$).

The anti-oxidation layer may have a thickness of 2 nm to 50 nm.

A technical solution for another objective of the present disclosure is as follows:

The present disclosure provides a manufacturing process of the film, including the following steps:

step 1. forming the bonding layer on the base layer;

step 2. coating an aluminum layer on the bonding layer, which is an aluminum material layer;

step 3. forming a reinforcement layer on the aluminum material layer;

step 4. repeating steps 2 and 3 to form a multilayer structure;

step 5. forming an aluminum material layer on the composite structure layer by an evaporation process; and step 6. forming an anti-oxidation layer on the aluminum material layer.

In step 6, the aluminum material layer obtained in step 5 is placed in a vacuum chamber of a single-sided or double-sided evaporation coating machine with a plasma device, then the vacuum chamber is sealed, and vacuum-pumping is conducted step by step until a vacuum degree reaches $10^{-4}$ Pa to $10^{-1}$ Pa; and with an evaporation source being turned off, argon and oxygen are ionized by the plasma device to clean and oxidize a surface of the aluminum material layer to obtain a dense $AlO_x$ ($1 \leq x \leq 1.5$) layer, which is the anti-oxidation layer.

In step 6, the aluminum material layer obtained in step 5 is placed in a high-temperature ozone reaction device, and a reaction temperature and an ozone content are adjusted to form a dense $AlO_x$ ($1 \leq x \leq 1.5$) layer on a surface of the aluminum material layer, which is the anti-oxidation layer.

The present disclosure provides a manufacturing process of the film, including the following steps:

step 1. forming the bonding layer on the base layer;

step 2. coating an aluminum layer on the bonding layer, which is an aluminum material layer;

step 3. forming a reinforcement layer on the aluminum material layer;

step 4. forming an aluminum material layer on the reinforcement layer by an evaporation process; and step 5. forming an anti-oxidation layer on the aluminum material layer.

In step 1, the bonding layer may be obtained by depositing a non-metallic compound on the base layer with one process from the group consisting of an evaporation process, an electron beam evaporation process, and a magnetron sputtering process, or may be deposited on the base layer by a chemical vapor deposition (CVD) process.

In step 3, the aluminum material layer obtained in step 2 may be statically aged for 1 d to 15 d at a temperature of 25° C. to 60° C. and a humidity lower than 50 to form a dense oxide layer, which is the reinforcement layer.

In step 3, the aluminum-coated film obtained in step 2 is placed in a vacuum chamber of a single-sided or double-sided reciprocating evaporation coating machine with a front or rear plasma device, then the vacuum chamber is sealed, and vacuum-pumping is conducted step by step until a vacuum degree reaches $10^{-4}$ Pa to $10^{-1}$ Pa; and before or after the aluminum-coated film enters an evaporation zone, argon and oxygen are ionized by the plasma device to clean and oxidize a surface of the aluminum-coated film to obtain a dense $AlO_x$ ($1 \leq x \leq 1.5$) layer, which is the reinforcement layer.

The present disclosure has the following beneficial effects:

The present disclosure provides a film including a base layer, where each of front and back sides of the base layer is provided with a bonding layer, a composite structure layer, an aluminum material layer, and an anti-oxidation layer in sequence; and the composite structure layer includes at least two structure layers, each structure layer is composed of an aluminum material layer and a reinforcement layer, and the multiple structure layers are stacked. With the composite structure layer, the film of the present disclosure can have a resistivity as low as $4.5 \times 10^{-8} \Omega \cdot m$, a peel force as high as 4.8 N to 5.2 N (it does refer to peel force here, and a peel strength is defined as a peel force per unit length, in unit of N/m), and improved bonding force and compactness.

In the figures, P represents a base layer, A represents a bonding layer, M represents an aluminum layer, R represents a reinforcement layer, and O represents an anti-oxidation layer.

DETAILED DESCRIPTION OF THE EMBODIMENTS

To make the objectives, technical solutions, and advantages of the present disclosure clearer, the present invention is further described in detail below with reference to the accompanying drawings and examples. It should be understood that the specific examples described herein are merely intended to explain the present disclosure, rather than to limit the present disclosure.

Example 1

A film including a base layer is provided, where each of front and back sides of the base layer is provided with a bonding layer, a composite structure layer, an aluminum material layer, and an anti-oxidation layer in sequence; and the composite structure layer includes at least two structure layers, each structure layer is composed of an aluminum material layer and a reinforcement layer, and the multiple structure layers are stacked.

|  | Peel force (N) | Resistivity |
|---|---|---|
| Bonding layer-aluminum material layer-anti-oxidation layer | 2.0 to 3.0 | $4.5 \times 10^{-8} \Omega \cdot m$ to $5.0 \times 10^{-8} \Omega \cdot m$ |
| Bonding layer-composite structure layer-aluminum material layer-anti-oxidation layer (multiple MR layers) | 3.0 to 5.5 | $3.0 \times 10^{-8} \Omega \cdot m$ to $6.0 \times 10^{-8} \Omega \cdot m$ |
| Bonding layer-aluminum material layer-reinforcement layer-aluminum material layer-anti-oxidation layer (single MR layer) | 3.0 to 4.0 | $4.2 \times 10^{-8} \Omega \cdot m$ to $4.8 \times 10^{-8} \Omega \cdot m$ |

|  | Number of layers | Cost | Peel force (N) | Resistivity ($\Omega \cdot m$) |
|---|---|---|---|---|
| Aluminum layer + reinforcement layer | 1 | 150% | 3.5 to 4.5 | $4.6 \times 10^{-8}$ to $4.8 \times 10^{-8}$ |
|  | 5 | 120% | 4.0 to 5.0 | $3.2 \times 10^{-8}$ to $3.6 \times 10^{-8}$ |
|  | 10 | 100% | 4.5 to 5.5 | $3.8 \times 10^{-8}$ to $4.2 \times 10^{-8}$ |
|  | 20 | 150% | 4.5 to 5.5 | $4.5 \times 10^{-8}$ to $5.0 \times 10^{-8}$ |
|  | 30 | 200% | 3.5 to 4.5 | $5.0 \times 10^{-8}$ to $5.5 \times 10^{-8}$ |
|  | 50 | 300% | 3.0 to 4.0 | $5.5 \times 10^{-8}$ to $6.0 \times 10^{-8}$ |

2 to 50 structure layers may be provided.

10 to 30 structure layers may be provided.

The base layer may be made of one or more materials from the group consisting of OPP, PET, PI, PS, PPS, CPP, PEN, PVC, SPS, PEEK, PES, PPSU, PE, and non-woven fabric. When the base layer is made of two or more materials, the two or more materials are subjected to co-extrusion to form the base layer.

The base layer may have a thickness of 1.2 μm to 12 μm.

Example 2

Figure 1:
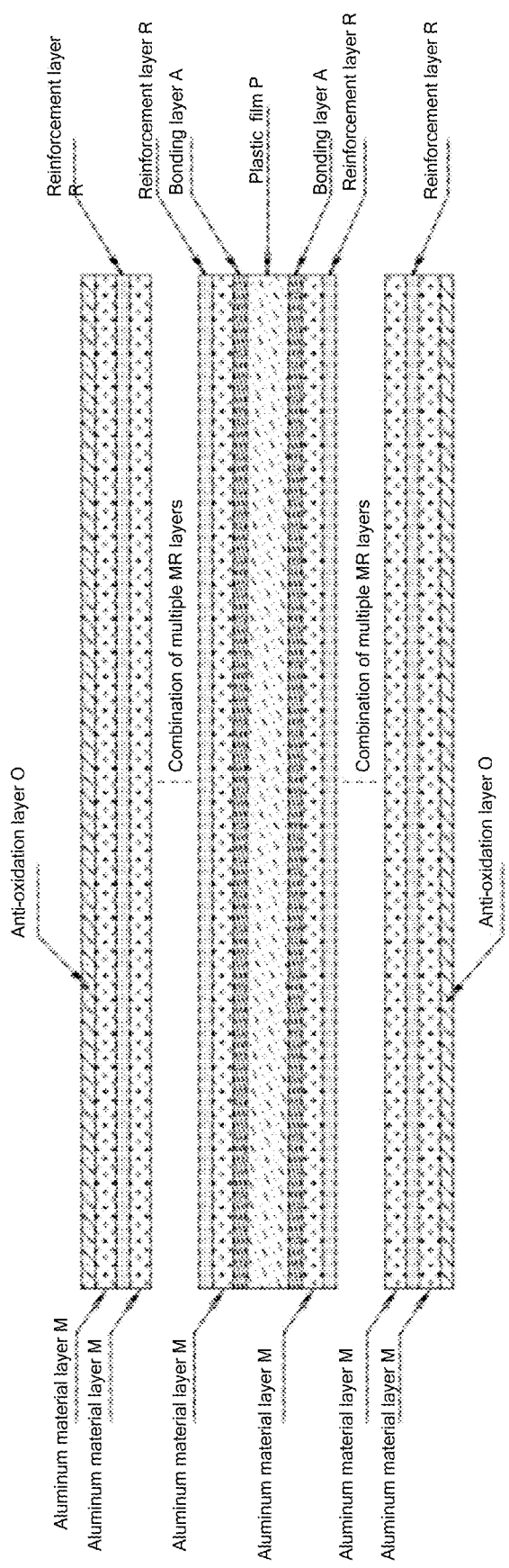
FIG. 1 is a schematic structural diagram of the film according to the present disclosure.
Figure 2:
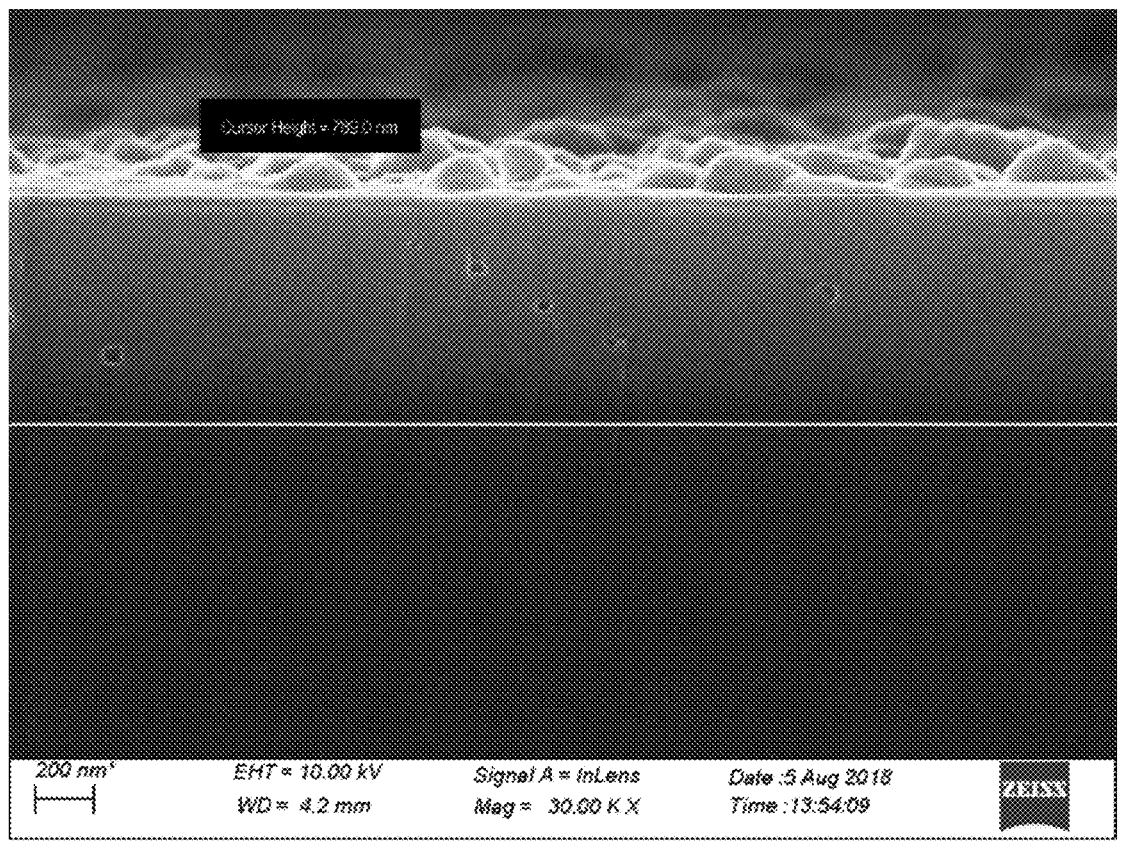
FIG. 2 is a scanning electron microscopy (SEM) image of a film A according to the present disclosure.

One of the implementations of the film of the present disclosure is provided, as shown in FIG. 2. The main technical solution of this example is basically the same as that of Example 1. The features that are not explained in this example can be comprehended according to the explanations in Example 1, which will not be repeated here. This example is different from Example 1 in that the film includes a base layer, and the base layer is provided with a bonding layer, an aluminum material layer, a reinforcement layer, an aluminum material layer, and an anti-oxidation layer in sequence.

With the composite structure layer of the present disclosure, the film can have low resistivity and large peel force. The design of the reinforcement layer improves the peel force, and the aluminum material layer can effectively ensure the conductivity.

Example 3

Figure 3:
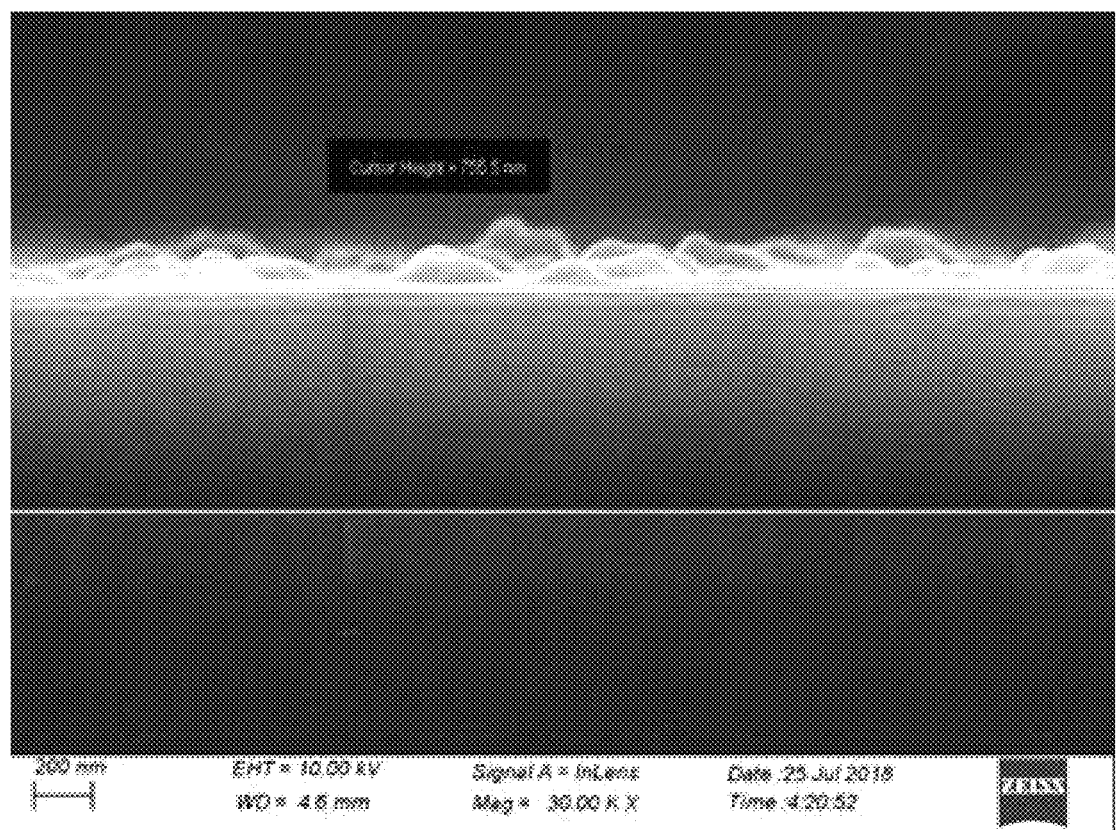
FIG. 3 is an SEM image of a film B according to the present disclosure.
Figure 4:
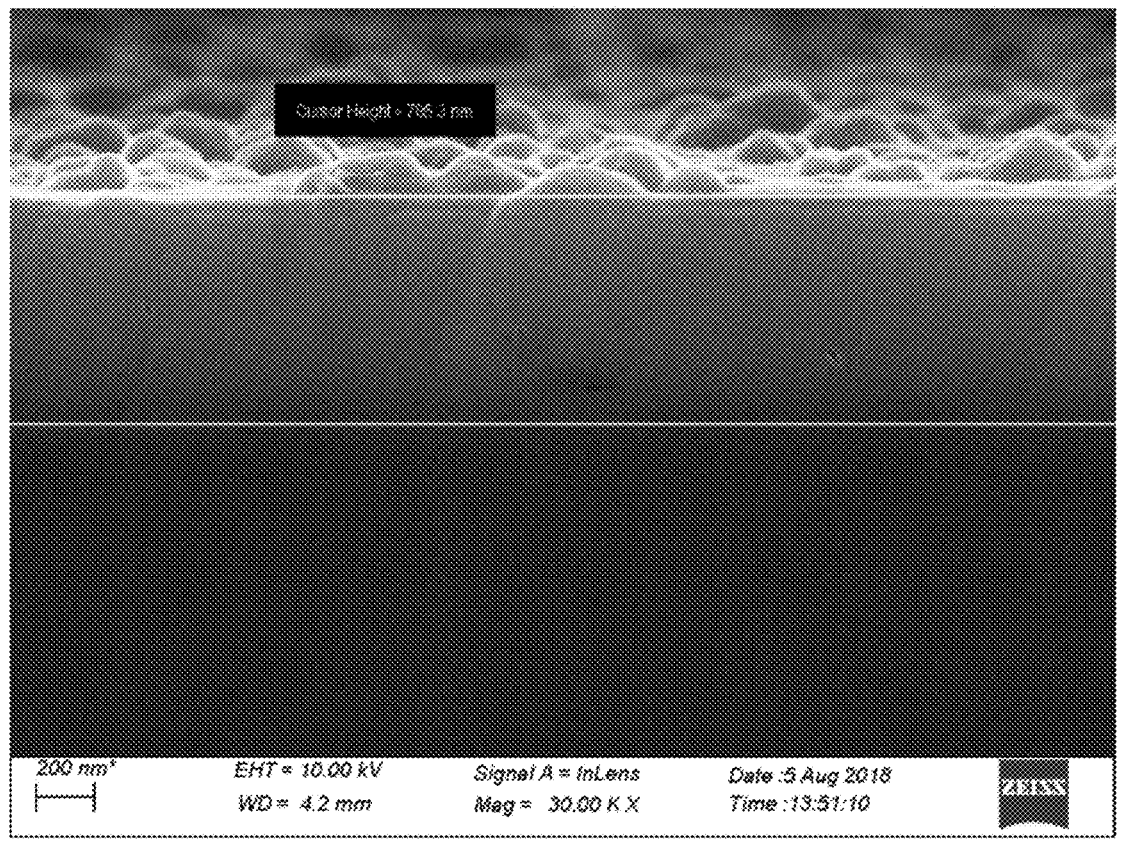
FIG. 4 is an SEM image of a film C according to the present disclosure.

One of the implementations of the film of the present disclosure is provided, as shown in FIG. 3. The main technical solution of this example is basically the same as that of Examples 1 and 2. The features that are not explained in this example can be comprehended according to the explanations in Examples 1 and 2, which will not be repeated here. This example is different from Examples 1 and 2 in that: the bonding layer is a non-metallic material layer, and the non-metallic material is at least one from the group consisting of SiC, $Si_3N_4$, $SiO_x$ (1.5≤x≤2), and $AlO_x$ (1≤x≤1.5).

| Bonding layer | Corrosion resistance | Process cost | Thickness (nm) |
|---|---|---|---|
| SiC | High | 200% | 10 to 40 |
| $Si_3N_4$ | High | 400% | 10 to 40 |
| $SiO_x$ (1.5 ≤ x ≤ 2) | High | 300% | 10 to 40 |
| $AlO_x$ (1 ≤ x ≤ 1.5) | Medium | 100% | 8 to 20 |

The bonding layer may have a thickness of 2 nm to 50 nm.

The bonding layer has a thickness of 8 nm to 20 nm when composed of $AlO_x$ (1≤x≤1.5); and the bonding layer has a thickness of 10 nm to 40 nm when composed of $SiO_x$ (1.5≤x≤2). The aluminum material layer may have a thickness of 20 nm to 1,500 nm. Preferably, the aluminum material layer may have a thickness of 20 nm to 100 nm.

The reinforcement layer may be a dense non-metallic material layer with a composition of $AlO_x$ (1≤x≤1.5), and may have a thickness of 2 nm to 50 nm.

The reinforcement layer may have a thickness of 3 nm to 6 nm.

The anti-oxidation layer may be a dense non-metallic material layer with a composition of $AlO_x$ (1≤x≤1.5). The anti-oxidation layer may have a thickness of 2 nm to 50 nm.

Example 4

One of the implementations of the film of the present disclosure is provided. The main technical solution of this example is basically the same as that of Examples 1, 2, and 3. The features that are not explained in this example can be comprehended according to the explanations in Examples 1, 2, and 3, which will not be repeated here. This example is different from Examples 1, 2, and 3 in that:

A manufacturing process of the film is provided, including the following steps:

step 1. the bonding layer is formed on the base layer;

step 2. an aluminum layer is coated on the bonding layer, which is an aluminum material layer;

step 3. a reinforcement layer is formed on the aluminum material layer;

step 4. steps 2 and 3 are repeated to form a multilayer composite structure;

step 5. an aluminum material layer is formed on the composite structure layer by an evaporation process; and step 6. an anti-oxidation layer is formed on the aluminum material layer.

In step 6, the aluminum material layer obtained in step 5 is placed in a vacuum chamber of a single-sided or double-sided evaporation coating machine with a plasma device, then the vacuum chamber is sealed, and vacuum-pumping is conducted step by step until a vacuum degree reaches $10^{-4}$ Pa to $10^{-1}$ Pa; and with an evaporation source being turned off, argon and oxygen are ionized by the plasma device to clean and oxidize a surface of the aluminum material layer to obtain a dense $AlO_x$ (1≤x≤1.5) layer, which is the anti-oxidation layer.

In step 6, the aluminum material layer obtained in step 5 is placed in a high-temperature ozone reaction device, and a reaction temperature and an ozone content are adjusted to form a dense $AlO_x$ (1≤x≤1.5) layer on a surface of the aluminum material layer, which is the anti-oxidation layer.

Example 5

One of the implementations of the film of the present disclosure is provided. The main technical solution of this example is basically the same as that of Example 4. The features that are not explained in this example can be comprehended according to the explanations in Example 4, which will not be repeated here. This example is different from Example 4 in that:

A manufacturing process of the film is provided, including the following steps:

step 1. the bonding layer is formed on the base layer;

step 2. an aluminum layer is coated on the bonding layer, which is an aluminum material layer;

step 3. a reinforcement layer is formed on the aluminum material layer;

step 4. an aluminum material layer is formed on the reinforcement layer by an evaporation process; and step 5. an anti-oxidation layer is formed on the aluminum material layer.

In step 1, the bonding layer may be obtained by depositing a non-metallic compound on the base layer with a physical vapor deposition (PVD) process (specifically one process from the group consisting of an evaporation process, an electron beam evaporation process, and a magnetron sputtering process), or may be deposited on the base layer by a CVD process.

In step 3, the aluminum material layer obtained in step 2 may be statically aged for 1 d to 15 d at a temperature of 20° C. to 60° C. and a humidity lower than 50% to form a dense oxide layer, which is the reinforcement layer.

In step 3, the aluminum-coated film obtained in step 2 is placed in a vacuum chamber of a single-sided or double-sided reciprocating evaporation coating machine with a front or rear plasma device, then the vacuum chamber is sealed, and vacuum-pumping is conducted step by step until a vacuum degree reaches $10^{-4}$ Pa to $10^{-1}$ Pa; and before or after the aluminum-coated film enters an evaporation zone, argon and oxygen are ionized by the plasma device to clean and oxidize a surface of the aluminum-coated film to obtain a dense $AlO_x$ (1≤x≤1.5) layer, which is the reinforcement layer.

Example 6

One of the implementations of the film of the present disclosure is provided. The main technical solution of this example is basically the same as that of Examples 1 to 4. The features that are not explained in this example can be comprehended according to the explanations in Examples 1 to 4, which will not be repeated here. This example is different from Examples 1 to 4 in that:

A manufacturing process of a conductive functional film is provided, including the following steps:

S1. Corona treatment was conducted on a surface of a plastic film to be coated, then a roll of the plastic film was placed in a vacuum chamber of a vacuum coating machine, and the vacuum chamber was sealed; vacuum-pumping was conducted step by step until a vacuum degree reached $5\times10^{-2}$ Pa; and compressed oxygen was introduced through an oxygen introduction structure near an evaporation source at volume flow rates of 4,000 sccm and 3,500 sccm. An evaporation raw material at the evaporation source was aluminum wire or aluminum ingot with purity≥99.9%. A roll-in speed was set to 350 m/min, and a wire feeding rate was set to 300 mm/min. Evaporated aluminum atoms reacted with oxygen to form an $AlO_x$ ($1 \leq x \leq 1.5$) layer with a thickness of about 10 nm on the moving film, which was the bonding layer.

S2. The film with the bonding layer on the surface obtained in Si was placed in vacuum chambers of single-sided or double-sided reciprocating and non-reciprocating evaporation coating machines with plasma devices, separately, the vacuum chambers were sealed, and vacuum-pumping was conducted step by step until a vacuum degree reached 2×10 Pa; before the film entered into an evaporation zone, argon was ionized by the plasma device to clean a surface of the bonding layer, with an argon volume flow rate of 500 sccm; and then the film entered into the evaporation zone, and the aluminum with purity≥99.9% was continuously melted and evaporated in the evaporation mechanism to form an aluminum coating with a thickness of about 40 nm to 45 nm on the surface of the bonding layer, which was the aluminum material layer, where a roll-in speed was set to 300 m/min and a wire feeding rate was set to 1,100 mm/min.

S3. The aluminum-coated film obtained in S2 was placed in a vacuum chamber of a single-sided or double-sided reciprocating evaporation coating machine with a plasma device, then the vacuum chamber was sealed, and vacuum-pumping was conducted step by step until a vacuum degree reached $2 \times 10^{-2}$ Pa; and the S2 was continuously repeated 40 or 20 times in the chamber to obtain a film A.

Preferably, S3. The aluminum-coated film obtained in S2 was placed in a vacuum chamber of a single-sided or double-sided reciprocating evaporation coating machine with a plasma device, then the vacuum chamber was sealed, and vacuum-pumping was conducted step by step until a vacuum degree reached $2 \times 10^{-2}$ Pa; and before the aluminum-coated film entered into an evaporation zone, argon and oxygen were ionized by the plasma device to clean and oxidize a surface of the aluminum-coated film to form a dense $AlO_x$ ($1 \leq x \leq 1.5$) layer with a thickness of about 4 nm on the surface of the coated aluminum layer, which was the reinforcement layer, where an argon volume flow rate was set to 500 sccm and an oxygen volume flow rate was set to 350 sccm. Then the film entered into the evaporation zone, a roll-in speed, a roll-out speed, and an evaporation discharge were adjusted as desired, and the aluminum with purity≥99.9% was continuously melted and evaporated in the evaporation mechanism to form an aluminum coating on a surface of the bonding layer; and according to the design of single-sided or double-sided molding of the device, this step was repeated 40 or 20 times to obtain a film B.

S4. The aluminum-coated film obtained in S3 was statically aged for 1 d to 15 d and preferably for 48 h at a temperature of 20° C. to 60° C. and a humidity lower than 50%. A dense oxide layer with a thickness of about 2 nm to 4 nm was formed on a surface of the aluminum-coated film due to the permeation of oxygen or a small amount of moisture in the air, which was the anti-oxidation layer.

Peel Force Test Method:

1. Heat sealing: a five-point heat sealing instrument was used to heat seal the films A and B with EAA, with a heating temperature of 120° C., a pressure of 3 kg/cm², and a hot air time of 1 s; and 180° peel test was conducted:

2. Sample width: 15 mm, initial distance: 5 cm, and speed: 250 mm/min.

Performance Comparison Between Film a and Film B:

| Film surface | | Resistivity ($\Omega \cdot m$) | Peel force (N) |
|---|---|---|---|
| Film A | Bright silver can be observed by naked eyes, the film is slightly bright under strong light, and the film surface is smooth | $4.0 \times 10^{-8}$ to $4.5 \times 10^{-8}$ | 0.7 to 1.17 |
| Film B | Bright silver can be observed by naked eyes, the film is slightly dark under strong light, and the film surface is | $4.5 \times 10^{-8}$ to $5.0 \times 10^{-8}$ | 4.38 to 5.25 |

During the manufacturing of the film A, the chamber was contaminated by evaporated substances and needed to be opened regularly for cleaning, so there was still a small amount of $AlO_x$ ($1 \leq x \leq 1.5$). Compared with the film B, the film A showed a slightly-lower resistivity and a poor peel force, which was attributed to the following reasons: the absence of the reinforcement layer resulted in a poor bonding force; and due to the absence of reinforcement layer protection, the aluminum surface was heavily damaged in the winding system due to the friction between the aluminum surface and a roller surface, thus causing defects and holes. Due to the presence of the reinforcement layer, the film B can have both a high peeling force and a specified resistivity.

Example 7

One of the implementations of the film of the present disclosure is provided. The main technical solution of this example is basically the same as that of Examples 1 to 4. The features that are not explained in this example can be comprehended according to the explanations in Examples 1 to 4, which will not be repeated here. This example is different from Examples 1 to 4 in that:

S1. Corona treatment was conducted on a surface of a plastic film to be coated, then a roll of the plastic film was placed in a vacuum chamber of a vacuum coating machine, and the vacuum chamber was sealed; vacuum-pumping was conducted step by step until a vacuum degree reached $5 \times 10^{-2}$ Pa; and compressed oxygen was introduced through an oxygen introduction structure near an evaporation source at volume flow rates of 4,000 sccm and 3,500 sccm. An evaporation raw material at the evaporation source was aluminum wire or aluminum ingot with purity≥99.9%. A roll-in speed was set to 350 m/min, and a wire feeding rate was set to 300 mm/min. Evaporated aluminum atoms reacted with oxygen to form an $AlO_x$ ($1 \leq x \leq 1.5$) layer with a thickness of about 10 nm on the moving film, which was the bonding layer.

S2. The film with the bonding layer on the surface obtained in Si was placed in vacuum chambers of single-sided or double-sided reciprocating and non-reciprocating evaporation coating machines with plasma devices, separately, the vacuum chambers were sealed, and vacuum-pumping was conducted step by step until a vacuum degree reached $2 \times 10^{-2}$ Pa; before the film entered into an evaporation zone, argon was ionized by the plasma device to clean a surface of the bonding layer, with an argon volume flow rate of 500 sccm; and then the film entered into the evaporation zone, and the aluminum with purity≥99.9% was continuously melted and evaporated in the evaporation mechanism to form an aluminum coating with a thickness of about 800 nm to 850 nm on the surface of the bonding layer, which was the aluminum material layer, where a roll-in speed was set to 5 m/min and a wire feeding rate was set to 400 mm/min.

S4. The aluminum-coated film obtained in S3 was statically aged for 48 h at room temperature and a humidity lower than 50%. A dense oxide layer with a thickness of about 2 nm to 4 nm was formed on a surface of the aluminum-coated film due to the permeation of oxygen or a small amount of moisture in the air, which was the anti-oxidation layer. A film C was obtained.

Performance Comparison Among Films A, B and C:

|  | Film surface | Resistivity | Peel force (N) |
|---|---|---|---|
| Film A | Bright silver can be observed by naked eyes, the film is slightly bright under strong light, and the film surface is smooth | $4.0 \times 10^{-8}$ to $4.5 \times 10^{-8}$ | 0.7 to 1.17 |
| Film B | Bright silver can be observed by naked eyes, the film is slightly dark under strong light, and the film surface is smooth | $4.5 \times 10^{-8}$ to $5.0 \times 10^{-8}$ | 4.38 to 5.25 |
| Film C | Darkening can be observed by naked eyes, the membrane surface is deformed seriously, and there are a lot of uncoated lines | $4.5 \times 10^{-8}$ to $5.0 \times 10^{-8}$ | 2.35 to 2.82 |

Low-speed single-shot molding was adopted during the manufacturing of film C, so the film underwent a large amount of heat and was prone to thermal deformation, resulting in uncoated lines. Due to the slow move of the film, the moisture contained in the film itself was released under baking and reacted with aluminum on the film surface to form $Al(OH)_3$ or similar hydrated substances, and this reaction caused the film surface to become black from the inside to the outside. In addition, a too-large single-deposition amount caused a "bridging effect" during deposition, such that some holes were formed and the film C showed a worse peel force than the film B. However, due to the continuous baking, part of the $Al(OH)_3$ or hydrated substances was decomposed into $Al_2O_3$ to make up for some holes, which increased the peel force to some extent, so the film C showed a better peel force than the film A. Moreover, during the manufacturing of the film C, the chamber was heavily polluted due to a too-low speed, and there was a small number of finished products in a single shot.

In summary, the conductive functional film with a layer cake structure prepared from an appropriate number of repetitions exhibits considerable advantages in the comprehensive consideration of film surface, resistivity, and peel force.

The above merely describes a preferred specific implementation of the present disclosure, and the protection scope of the present disclosure is not limited thereto. A person skilled in the art can easily conceive modifications or replacements within the technical scope of the present disclosure, and these modifications or replacements shall fall within the protection scope of the present disclosure. Therefore, the protection scope of the present disclosure should be subject to the protection scope of the claims.

What is claimed is:

1. A film, comprising a base layer, wherein each of a front side and a back side of the base layer is provided with a bonding layer, a composite structure layer, a first aluminum material layer, and an anti-oxidation layer in sequence; and the composite structure layer comprises at least two structure layers, each structure layer is composed of a second aluminum material layer and a reinforcement layer, and the at least two structure layers are stacked;
   wherein the bonding layer is a non-metallic material layer, and the non-metallic material is at least one selected from the group consisting of SiC, $Si_3N_4$, and $SiO_x$ with $1.5 \leq x \leq 2$;
   wherein 2 to 50 structure layers are provided;
   wherein the reinforcement layer is a non-metallic material layer with a composition of $AlO_y$ with $1 \leq y \leq 1.5$; and
   wherein a peel force of the film is from 3.5 N to 5.5 N.

2. The film according to claim 1, wherein 2 to 25 structure layers are provided.

3. The film according to claim 1, wherein the base layer is made of one or more materials from the group consisting of OPP, PET, PI, PS, PPS, CPP, PEN, PVC, SPS, PEEK, PES, PPSU, PE, and non-woven fabric.

4. The film according to claim 3, wherein the base layer has a thickness of 1.2 μm to 12 μm.

5. The film according to claim 1, wherein the bonding layer has a thickness of 2 nm to 50 nm.

6. The film according to claim 1, wherein
   the non-metallic material layer of the bonding layer has a thickness of 10 nm to 40 nm when the non-metallic material is the $SiO_x$ with $1.5 \leq x \leq 2$.

7. The film according to claim 1, wherein the first aluminum material layer has a thickness of 20 nm to 1,500 nm.

8. The film according to claim 1, wherein the second aluminum material layer has a thickness of 20 nm to 500 nm.

9. The film according to claim 1, wherein the reinforcement layer has a thickness of 1 nm to 50 nm.

10. The film according to claim 1, wherein the reinforcement layer has a thickness of 1 nm to 8 nm.

11. The film according to claim 1, wherein the anti-oxidation layer is non-metallic material layer with a composition of $AlO_y$ with $1 \leq y \leq 1.5$.

12. The film according to claim 11, wherein the anti-oxidation layer has a thickness of 2 nm to 50 nm.

13. The film according to claim 11, wherein the anti-oxidation layer has a thickness of 3 nm to 12 nm.

14. A manufacturing process of the film according to claim 1, comprising the following steps:
   step 1) forming the bonding layer on the base layer;
   step 2) coating an aluminum layer on the bonding layer, wherein the aluminum layer is the second aluminum material layer;
   step 3) forming the reinforcement layer on the second aluminum material layer;
   step 4) repeating step 2 and step 3 to form a multilayer structure with 2 to 50 structure layers;
   step 5) forming the first aluminum material layer on the composite structure layer by an evaporation process; and
   step 6) forming the anti-oxidation layer on the first aluminum material layer.

15. The manufacturing process of the film according to claim 14, wherein in step 6, the first aluminum material layer obtained in step 5 is placed in a vacuum chamber of a single-sided or double-sided evaporation coating machine with a plasma device, then the vacuum chamber is sealed, and a vacuum-pumping is conducted step by step until a vacuum degree reaches $10^{-4}$ Pa to $10^{-1}$ Pa; and with an evaporation source being turned off, argon and oxygen are ionized by the plasma device to clean and oxidize a surface of the second aluminum material layer to obtain a dense $AlO_y$ layer with $1 \leq y \leq 1.5$, wherein the dense $AlO_y$ layer is the anti-oxidation layer.

16. The manufacturing process of the film according to claim 14, wherein in step 6, the first aluminum material layer obtained in step 5 is placed in a high-temperature ozone reaction device, and a reaction temperature and an ozone content are adjusted to form a dense $AlO_y$ layer with $1 \leq y \leq 1.5$ on a surface of the first aluminum material layer, wherein the dense $AlO_y$ layer with $1 \leq y \leq 1.5$ is the anti-oxidation layer.

17. The manufacturing process of the film according to claim 14, wherein in step 1, the bonding layer is deposited on the base layer by a physical vapor deposition (PVD) process or a chemical vapor deposition (CVD) process.

18. The manufacturing process of the film according to claim 14, wherein in step 3, the first aluminum material layer obtained in step 2 is statically aged for 1 d to 15 d at a temperature of 25° C. to 60° C. and a relative humidity lower than 0.5 to form a dense oxide layer, wherein the dense oxide layer is the reinforcement layer.

19. The manufacturing process of the film according to claim 14, wherein in step 3, an aluminum-coated film obtained in step 2 is placed in a vacuum chamber of a single-sided or double-sided reciprocating evaporation coating machine with a front or rear plasma device, then the vacuum chamber is sealed, and a vacuum-pumping is conducted step by step until a vacuum degree reaches $10^{-4}$ Pa to $10^{-1}$ Pa; and before or after the aluminum-coated film enters an evaporation zone, argon and oxygen are ionized by the front or rear plasma device to clean and oxidize a surface of the aluminum-coated film to obtain a dense $AlO_y$ layer with $1 \leq y \leq 1.5$, wherein the dense $AlO_y$ layer is the reinforcement layer.

* * * * *